United States Patent
Farahani Samani et al.

(10) Patent No.: US 8,417,197 B2
(45) Date of Patent: Apr. 9, 2013

(54) PRE-DISTORTION METHOD AND DEVICE TO ENHANCE THE POWER UTILITY OF POWER AMPLIFIERS IN WIRELESS DIGITAL COMMUNICATION APPLICATIONS

(75) Inventors: Amirhooshang Farahani Samani, Lausanne (CH); Jeyran Hezaveh, Lausanne (CH); Ali Talebi, Dearborn Heights, MI (US)

(73) Assignee: Innovaradio SA, Plan-les-Ouates (CH)

( * ) Notice: Subject to any disclaimer, the term of this patent is extended or adjusted under 35 U.S.C. 154(b) by 0 days.

(21) Appl. No.: 13/002,006

(22) PCT Filed: Jul. 2, 2009

(86) PCT No.: PCT/IB2009/052888
§ 371 (c)(1),
(2), (4) Date: Dec. 29, 2010

(87) PCT Pub. No.: WO2010/001357
PCT Pub. Date: Jan. 7, 2010

(65) Prior Publication Data
US 2011/0095821 A1    Apr. 28, 2011

Related U.S. Application Data

(60) Provisional application No. 61/133,710, filed on Jul. 2, 2008.

(51) Int. Cl.
*H04B 1/00* (2006.01)
(52) U.S. Cl. ..... 455/126; 455/91; 455/114.3; 455/115.1; 455/118; 375/295; 375/296; 375/297; 375/312
(58) Field of Classification Search .............. 455/91, 455/114.3, 115.1, 118, 126, 127.1; 375/295, 375/296, 297, 312
See application file for complete search history.

(56) References Cited

U.S. PATENT DOCUMENTS

| | | | |
|---|---|---|---|
| 6,275,106 | B1 | 8/2001 | Gomez |
| 6,798,843 | B1 | 9/2004 | Wright et al. |
| 7,068,730 | B2 * | 6/2006 | Monta ............................ 375/298 |
| 7,106,806 | B1 * | 9/2006 | Kenington ..................... 375/297 |
| 2003/0184372 | A1 | 10/2003 | Fudaba et al. |
| 2004/0021514 | A1 | 2/2004 | Ring |
| 2004/0179629 | A1 | 9/2004 | Song et al. |
| 2004/0189378 | A1 | 9/2004 | Suzuki et al. |
| 2008/0068080 | A1 | 3/2008 | Miyatani et al. |
| 2008/0187035 | A1 | 8/2008 | Nakamura et al. |
| 2008/0197925 | A1 | 8/2008 | Furuta et al. |

FOREIGN PATENT DOCUMENTS

| | | |
|---|---|---|
| EP | 1 463 198 | 9/2004 |
| GB | 2 359 432 | 8/2001 |
| WO | WO 01/05026 | 1/2001 |
| WO | 2007/046370 | 4/2007 |

OTHER PUBLICATIONS

U.S. Appl. No. 13/509,893.
International Search Report issued in International Application No. PCT/IB2009/052888 mailed Oct. 12, 2009.
Written Opinion issued in International Application No. PCT/IB2009/052888 mailed Oct. 12, 2009.
International Search Report issued in International Application No. PCT/EP2010/067611 mailed Feb. 2, 2011.
Written Opinion issued in International Application No. PCT/EP2010/067611 mailed Feb. 2, 2011.

* cited by examiner

*Primary Examiner* — Tuan Pham
(74) *Attorney, Agent, or Firm* — DLA Piper LLP US

(57) ABSTRACT

The present invention concerns the field of power amplifiers and in particular the enhancement of the performance of the amplifier by a feedback loop acting on the input signal. We present a method for linearizing a power amplifier circuit having as input signal a digital base-band input signal, (x), a power output signal $8z$), a power amplifier (PA) and a linearizer module (LM).

16 Claims, 4 Drawing Sheets

PRE-DISTORTION METHOD AND DEVICE TO ENHANCE THE POWER UTILITY OF POWER AMPLIFIERS IN WIRELESS DIGITAL COMMUNICATION APPLICATIONS

INTRODUCTION

The present invention concerns the field of power amplifiers and in particular the enhancement of the performance of the amplifier by a feedback loop acting on the input signal. This invention can be used in each and every wireless communication transmitter, since there is definitely a power amplifier in the last part of the transmitter before the antenna, and every power amplifier has limited power performance (depending on type of modulation) due to its input-output curve. We are aiming to enhance the power utility of power amplifiers in different applications through introducing a new method of pre-distortion for mitigating linear and non-linear distortions of power amplifiers.

PRIOR ART

Nowadays, there are many different methods for linearization of power amplifiers which generally use look-up-tables (LUT) and/or use off-line methods for training the coefficients and LUTs once. Also, there are many adaptive methods which constantly adapt the coefficients and data used for linearization. Currently, majority of these adaptive methods are developed in time-domain and generally need training signals (such as pre- and post-ambles in the signal). Moreover, almost based on all current methods you cannot build a stand-alone, plug-and-play module which can be used in variety of current applications.

We are offering a novel method and system for linearization of PAs both in frequency domain and time domain, which can be implemented as a stand-alone plug-and-play module which is configurable, and is independent of many major parameters in wireless systems such as modulation, peak-to-average power ratio (PAPR) of the signal, and type of power amplifier (which is not the case in each and every other method presented so far).

Power amplifier circuits (output stages) are classified as A, B, AB and C for analog designs, and class D and E for switching designs based upon the conduction angle or 'angle of flow' $\Theta$ of the input signal through the amplifying device, that is, the portion of the input signal cycle during which the amplifying device conducts. The image of the conduction angle is derived from amplifying a sinusoidal signal. (If the device is always on, $\Theta=360°$.) The angle of flow is closely related to the amplifier power efficiency. The various classes are introduced below.

Class A

100% of the input signal is used (conduction angle $\Theta=360°$ or $2\pi$, i.e. the active element works in its linear range all of the time). Where efficiency is not a consideration, most small signal linear amplifiers are designed as Class A, which means that the output devices are always in the conduction region. Class A amplifiers are typically more linear and less complex than other types, but are very inefficient. This type of amplifier is most commonly used in small-signal stages or for low-power applications (such as driving headphones).

Class B

50% of the input signal is used ($\theta=180°$ or $\pi$, i.e. the active element works in its linear range half of the time and is more or less turned off for the other half). In most Class B, there are two output devices (or sets of output devices), each of which conducts alternately for exactly 180 deg (or half cycle) of the input signal; selective RF amplifiers can also be implemented using a single active element.

These amplifiers are subject to crossover distortion if the handoff from one active element to the other is not perfect, as when two complimentary transistors (i.e. one PNP, one NPN) are connected as two emitter followers with their base and emitter terminals in common, requiring the base voltage to slew across the region where both devices are turned off.

Class AB

Here the two active elements conduct more than half of the time as a means to reduce the cross-over distortions of Class B amplifiers. In the example of the complementary emitter followers a bias network allows for more or less quiescent current thus providing an operating point somewhere between Class A and Class B. Sometimes a figure is added, e.g. AB1 or AB2, with higher figures implying a higher quiescent current and therefore more of the properties of Class A.

Class D

Main article: These use switching to achieve a very high power efficiency (more than 90% in modern designs). By allowing each output device to be either fully on or off, losses are minimized. The analog output is created by pulse width modulation (PWM), i.e. the active element is switched on for shorter or longer intervals instead of modifying its resistor. There are more complicated switching schemes like sigma-delta modulation, to improve some performance aspects like lower distortions or better efficiency.

Other Classes

There are several other amplifier classes, although they are mainly variations of the previous classes. For example, Class H and Class G amplifiers are marked by variation of the supply rails (in discrete steps or in a continuous fashion, respectively) following the input signal. Wasted heat on the output devices can be reduced as excess voltage is kept to a minimum. The amplifier that is fed with these rails itself can be of any class. These kinds of amplifiers are more complex, and are mainly used for specialized applications, such as very high-power units. Also, Class E and Class F amplifiers are commonly described in literature for radio frequencies applications where efficiency of the traditional classes deviate substantially from their ideal values. These classes use harmonic tuning of their output networks to achieve higher efficiency and can be considered a subset of Class C due to their conduction angle characteristics.

Each and every RF power amplifier distorts the input signal when the input signal power reaches close to saturation level of PA. These distortions can be modeled as AM/AM and AM/PM distortions which have described in a lot of literatures of communication. In some applications such as in OFDM systems, because of sensitivity of receivers to these types of distortions, the designers of total communication system use the PA in a sufficient margin from its saturation point to make sure that the output signal is not distorted more than acceptable threshold. Using different methods of pre-distortion, this margin can be reduced and the power utility of PA can be increased.

BRIEF DESCRIPTION OF THE INVENTION

In order to compensate the natural distortion of a power amplifier when a digital signal is being transmitted, we propose a method for linearizing comprising a power amplifier having as input signal a digital base-band input signal, a power output signal, a power amplifier and a linearizer module (LM), this method comprising the steps of:

extracting a RF feedback signal from the power output signal, down-converting the RF feedback signal to IF feedback signal, filtering the IF feedback signal with a band-pass filter, digitally converting the filtered IF feedback signal into a feedback digital signal, converting the feedback digital signal into frequency-domain using fast-Fourier transform FFT on blocks of n-samples to obtain feedback FB-FFT blocks, averaging at least two blocks of feedback FB-FFT blocks to obtain an averaged FB-FFT block, converting the input base-band digital signal into frequency-domain using fast-Fourier transform FFT on blocks of n-samples to obtain input FF-FFT blocks, averaging at least two blocks of input FF-FFT blocks to obtain an averaged FF-FFT block, dividing the averaged FF-FFT block with the averaged FB-FFT block to obtain FFT correction values, obtaining TD filter coefficient values based on FFT correction values, applying the TD filter coefficient values to a digital band-pass filter, the input of said digital filter being the input base-band digital signal, converting the output of the digital band-pass filter into analog with a digital to analog converter to obtain a corrected IF input signal, applying the band-pass filter to the corrected IF input signal, up-converting the filtered corrected IF input signal to obtain a corrected RF input signal, applying the corrected RF input signal to the power amplifier so as to produce the power output signal.

BRIEF DESCRIPTION OF THE DRAWINGS

The present invention and its advantages will be better understood thanks to the enclosed detailed description of a particular embodiment and to the enclosed drawings, in which.

DETAILED DESCRIPTION OF THE INVENTION

This invention can be used in each and every wireless communication transmitter, since there is definitely a power amplifier in the last part of the transmitter before the antenna, and every power amplifier has limited power performance due to its input-output curve and type of modulation of input signal. We are aiming to enhance the power utility of power amplifiers in different applications through introducing a new method of pre-distortion for mitigating linear and non-linear distortions of power amplifiers.

Nowadays, there are many different methods for linearization of power amplifiers which generally use look-up-tables (LUT) and/or use off-line methods for training the coefficients and LUTs once. Also, there are many adaptive methods which constantly adapt the coefficients and data used for linearization. Currently, majority of these adaptive methods are developed in time-domain and generally need training signals (such as pre- and post-ambles in the signal). Moreover, almost based on all current methods you cannot build a stand-alone, plug-and-play module which can be used in different current applications.

We are offering a novel method and system for linearization of PAs in time and frequency domain, which can be implemented as a stand-alone plug-and-play module which is configurable, and is independent of many major parameters in wireless systems such as modulation, type and class of power amplifier, and peak-to-average power ratio of input signal.

Figure 1:
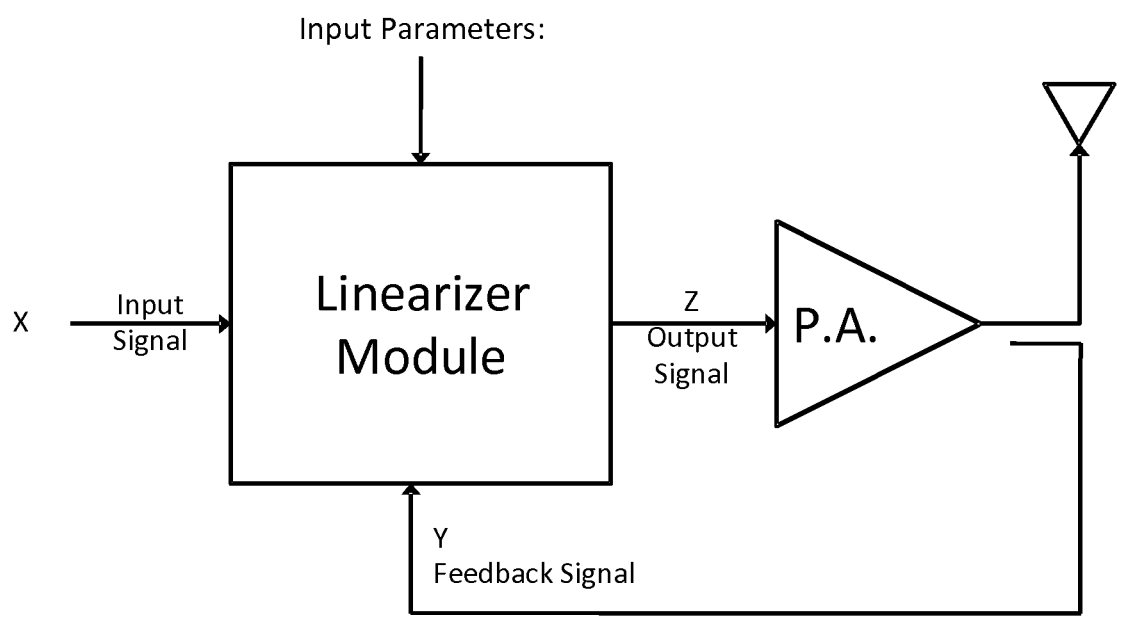
FIG. 1 illustrates the power amplifier circuit with its linearizer module

A Linearizer Module (LM) within an embodiment of a Power Amplifier Circuit (FIG. 1) is presented. This Linearizer Module connected with the input signal X (which can be digital baseband signal or radio frequency (RF) signal, and can come from a modulator or a transmitter or a power amplifier driver), the output signal Z (which is a RF signal and enters into the power amplifier) and the feedback signal Y (which is a RF sample signal coming from the output of power amplifier). The feedback signal can be sampled from the output of power amplifier using a coupler and/or attenuator, which exists already in all power amplifier configurations for many purposes. This feedback signal should be almost in the same level as input signal, though the exact level is not important at all.

This linearizer module can be implemented as a stand-alone module or an integrated module within a modulator or a transmitter.

Figure 2:
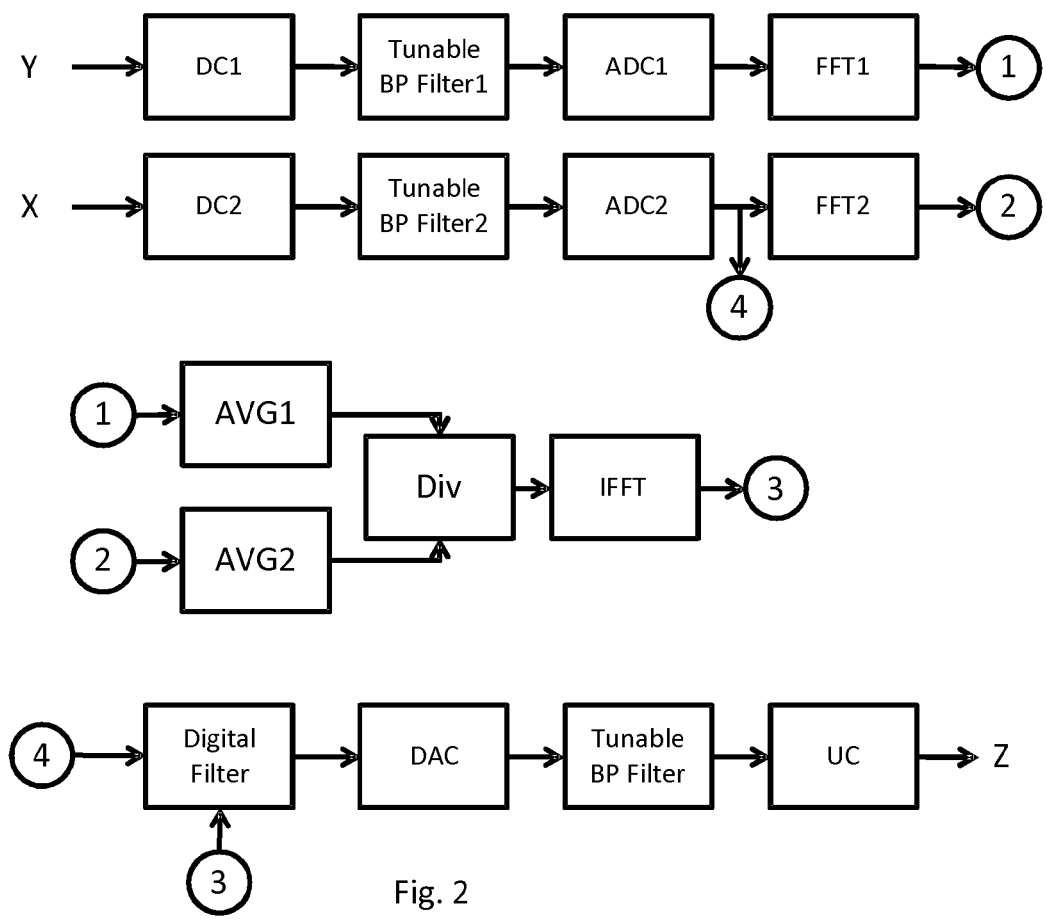
FIG. 2 illustrates a first embodiment of the linearizer module with RF input signal

As depicted in FIG. 2, this linearizer module converts feedback RF signal Y (from power amplifier) into Intermediate Frequency (IF) band (module DC1 in FIG. 2). Selection of IF frequency depends on design constraints (like typical bandwidth of signals, type of used A/D . . . ), and it can be from 10 MHz up to 100 MHz. After filtering IF signal through a band-pass filter (module Tunable BP Filter1 in FIG. 2), it is converted into digital domain using an Analog-to-Digital (A/D) converter (module ADC1 in FIG. 2). The result is named "feedback digital signal". The reference "FB" is to understand as "feedback" for the below description. Then using a FFT1 module (Fast-Fourier Transform), a conversion is done on the feedback digital signal to obtain FB-FFT blocks. Each FB-FFT block includes N samples, in which N is defined by the system designer as one of the module input parameters. Typically N must be larger than 512, and it's better to be a power of 2.

As depicted in FIG. 2, this linearizer module converts input RF signal X (from modulator) into Intermediate Frequency (IF) band (module DC2 in FIG. 2), and after filtering IF signal through a band-pass filter (module Tunable BP Filter2 in FIG. 2), it's converted into digital domain using an Analog-to-Digital (A/D) converter (module ADC2 in FIG. 2). (The IF frequency is exactly the same as the frequency used for feedback signal.) The result is feed-forward input digital signal. The reference "FF" is to understand as "feed-forward" for the below description. Then using a FFT2 module, a conversion is performed on the feed-forward input digital signal to produce feed-forward FFT blocks (FF-FFT blocks). In the case the input to Linearizer Module is digital baseband signal, the embodiment of Linearizer Module depicted in FIG. 3, in which we don't need to down-convert, filter and convert to digital domain for input signal X.

Figure 4:
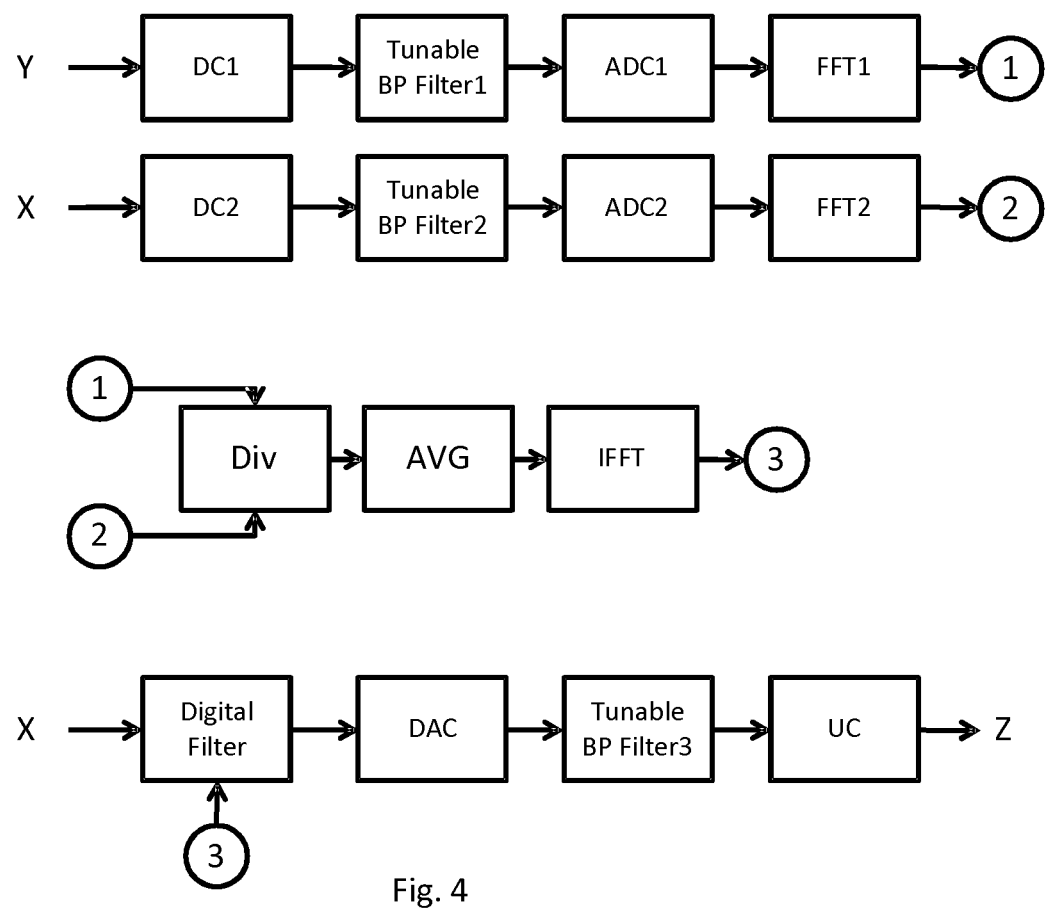
FIG. 4 illustrates a third embodiment of the linearizer module with RF input signal and a divider module placed before the averaging module

Then, as depicted in FIG. 2, FB-FFT blocks and FF-FFT blocks go though averaging modules (AVG1 and AVG2), and after averaging on at least 2 blocks, the two averaged blocks enters into a division module (DIV), in which averaged FF-FFT block divides by averaged FB-FFT block. This division should be done as a point-by-point array division, and so the result is a new block comprising the same number of samples as FF-FFT and FB-FFT blocks. The output of the division module is converted to time domain through IFFT module (Inverse Fast Fourier Transform). Because the point-by point multiplication in frequency domain is translated into a convolution operation in time domain, output of IFFT-module can be considered as time-domain filter coefficients The obtaining of the filter coefficient values can be implemented in other way as depicted in FIG. 4, in which FB-FFT blocks and FF-FFT blocks enter into a division module (DIV module in FIG. 4), and then the results of the division go through the averaging module (AVG in FIG. 4). The output of the averaging module is converted into time domain through IFFT module, producing the filter coefficients values.

Figure 3:
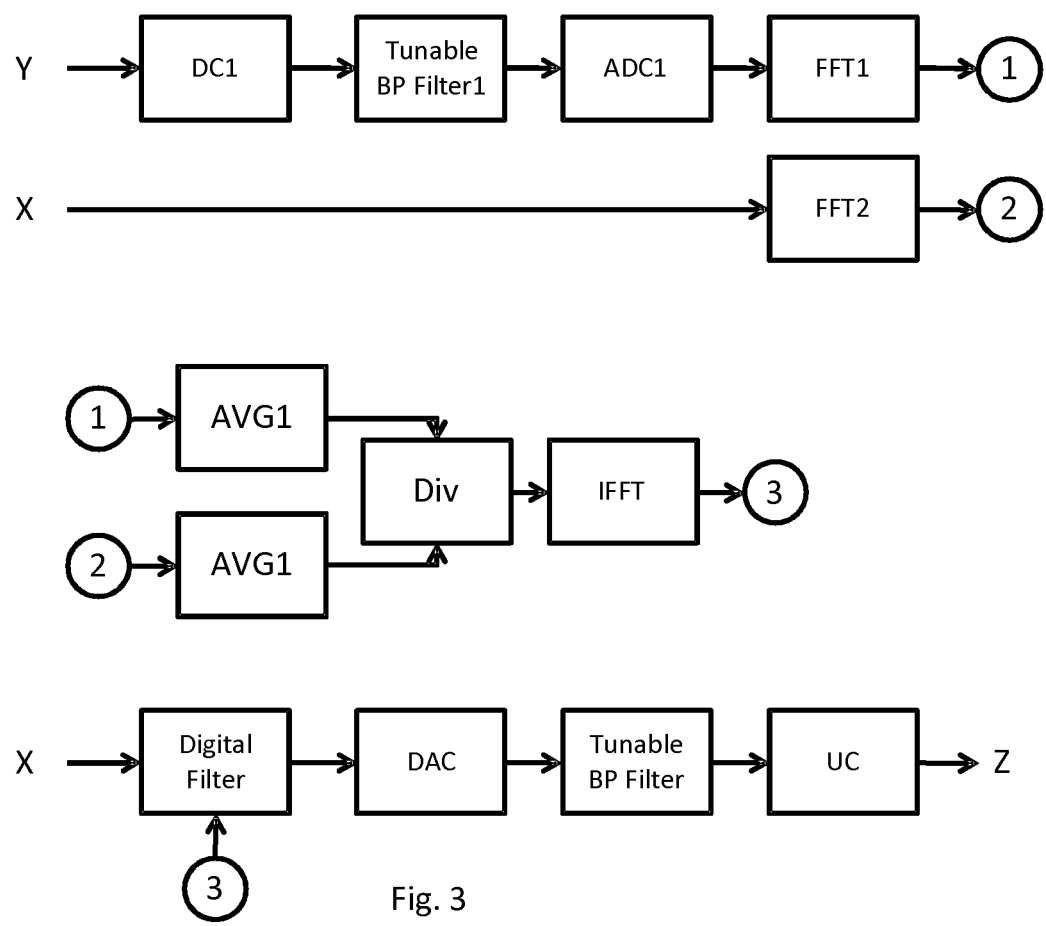
FIG. 3 illustrates a second embodiment of the linearizer module with base-band input signal

These filter coefficients are applied into a digital filter (Digital Filter module in FIG. 2, FIG. 3 and FIG. 4). Now, the input baseband digital signal passes through Digital Filter module, which pre-distorts the signal for compensating linear and non-linear distortions of power amplifier.

The filtered signal is converted into analog using Digital-to-Analog converter (DAC module in FIG. 2, FIG. 3, and FIG. 4). The output passes Tunable BP filter, and then is up-converted to RF signal Z using UC module, which is the output of Linearizer Module.

The invention claimed is:

1. A method for linearizing a power amplifier circuit having as input signal a digital base-band input signal, a power output signal, a power amplifier and a linearizer module (LM), the method comprising the steps of:
   extracting a radio frequency (RF) feedback signal from the power output signal;
   down-converting the RF feedback signal to an intermediate frequency (IF) feedback signal;
   filtering the IF feedback signal with a band-pass filter;
   digitally converting the filtered IF feedback signal into a feedback digital signal;
   converting the feedback digital signal into a frequency-domain using a Fast-Fourier Transform (FFT) on blocks of n-samples to obtain feedback-FFT (FB-FFT) blocks;
   averaging at least two blocks of feedback FB-FFT blocks to obtain an averaged FB-FFT block;
   converting the input base-band digital signal into a fre-quency-domain using FFT on blocks of n-samples to obtain input feed-forward-FFT (FF-FFT) blocks;
   averaging at least two blocks of input FF-FFT blocks to obtain an averaged FF-FFT block;
   dividing the averaged FF-FFT block with the averaged FB-FFT block to obtain FFT correction values;
   obtaining time domain (TD) filter coefficient values based on FFT correction values;
   applying the TD filter coefficient values to a digital band-pass filter, the input of said digital filter being the input base-band digital signal;
   converting the output of the digital band-pass filter into analog with a digital to analog converter to obtain a corrected IF input signal;
   applying the band-pass filter to the corrected IF input signal;
   up-converting the filtered corrected IF input signal to obtain a corrected RF input signal; and
   applying the corrected RF input signal to the power amplifier so as to produce the power output signal.

2. The method of claim 1, wherein to obtain the TD filter coefficient values it comprises the step of converting the FFT correction values into time domain to obtain the TD filter coefficient values.

3. The method of claim 1, in which the input signal of the power amplifier circuit is a RF input signal, the method comprising the steps of:
   down-converting the RF input signal into IF input signal;
   filtering the IF input signal with a band-pass filter; and
   digitally converting the IF filtered input signal into digital base-band input signal.

4. The method of claim 1, in which the band-pass filter is programmable according to the input signal bandwidth.

5. A method for linearizing a power amplifier circuit having as input signal a digital base-band input signal, a power output signal, a power amplifier and a linearizer module (LM), the method comprising the steps of:
   extracting a radio frequency (RF) feedback signal from the power output signal;
   down-converting the RF feedback signal to an intermediate frequency (IF) feedback signal;
   filtering the IF feedback signal with a band-pass filter;
   digitally converting the filtered IF feedback signal into a feedback digital signal;
   converting the feedback digital signal into a frequency-domain using a Fast-Fourier Transform (FFT) on blocks of n-samples to obtain feedback-FFT (FB-FFT) blocks;
   converting the input digital signal into a frequency-domain using FFT on a block of n-samples to obtain a input feed-forward-FFT (FF-FFT) block;
   dividing the input FF-FFT block with the feedback FB-FFT block to obtain FFT correction blocks;
   averaging at least two blocks of FFT correction blocks to obtain FFT correction values;
   obtaining time domain (TD) filter coefficient values based on FFT correction values;
   applying the TD filter coefficient values to a digital band-pass filter, the input of said digital filter being the input base-band digital signal;
   converting the output of the digital band-pass filter into analog with a digital to analog converter to obtain a corrected IF input signal;
   applying the band-pass filter to the corrected IF input signal;
   up-converting the filtered corrected IF input signal to obtain a corrected RF input signal; and
   applying the corrected RF input signal to the power amplifier so as to produce the power output signal.

6. The method of claim 5, wherein, in order to obtain the TD filter coefficient values, it comprises the step of converting the FFT correction values into time domain to obtain the TD filter coefficient values.

7. The method of claim 5, in which the input signal of the power amplifier circuit is a RF input signal, the method comprising the steps of:
   down-converting the RF input signal into IF input signal;
   filtering the IF input signal with a band-pass filter; and
   converting the filtered IF input signal into digital base-band input signal.

8. The method of claim 5, in which the band-pass filter is programmable according the input signal bandwidth.

9. A power amplifier circuit having as input signal a digital base-band input signal, a power output signal, a power amplifier and a linearizer module (LM) connected with the input signal, the output signal and the feedback signal, the linearizer module comprising:
   a down-converter to convert a feedback radio frequency (RF) signal into a feedback intermediate frequency (IF) signal;
   a first band-pass filter to filter the feedback IF signal;

a first Analog-to-Digital (A/D) converter to convert the filtered feedback IF signal into feedback digital signal;
a first Fast-Fourier Transform (FFT) module to convert the feedback digital signal into feedback-FFT (FB-FFT) blocks;
a second FFT module to convert the input signal into feed-forward-FFT (FF-FFT) blocks;
a division module to divide the input FF-FFT block by the feedback FB-FFT block to obtain FFT correction blocks;
an averaging module to average at least two blocks of FFT correction blocks to obtain FFT correction values;
an inverse FFT module to convert the FFT correction values into time domain (TD) filter coefficient values;
a digital band-pass filter receiving the TD filter coefficient values, the input of said digital filter being the input digital signal;
a digital-to-analog (D/A) converter to convert the output of the band-pass filter into analog to obtain a corrected IF input signal;
a second band-pass filter having as input the corrected IF input signal;
an up-converter to convert the filtered corrected IF input signal in order to obtain a corrected RF input signal; and
means to apply the corrected RF input signal to the power amplifier.

10. The system of claim 9, in which the input signal is a RF input signal, the linearizer module comprising:
a second down-converter to convert the input RF signal into IF input signal;
a third band-pass filter to filter the IF input signal; and
a second A/D converter to convert the filtered IF input signal into base-band digital signal.

11. The system of claim 9, in which the band-pass filters are digitally programmable for defining the bandwidth of said filter.

12. A power amplifier circuit having as input signal a digital base-band input signal, a power output signal, a power amplifier and a linearizer module (LM) connected with the input signal, the output signal and the feedback signal, the linearizer module comprising:
a down-converter to convert a feedback radio frequency (RF) signal into a feedback intermediate frequency (IF) signal;
a first band-pass filter to filter the feedback IF signal;
a first Analog-to-Digital (A/D) converter to convert the filtered feedback IF signal into feedback digital signal;
a first Fast-Fourier Transform (FFT) module to convert the feedback digital signal into feedback-FFT (FB-FFT) blocks;
a second FFT module to convert the input signal into feed-forward-FFT (FT-FFT) blocks;
a first averaging module to average at least two blocks of FF-FFT blocks to obtain an averaged FF-FFT blocks;
a second averaging module to average at least two blocks of FB-FFT blocks to obtain an averaged FB-FFT blocks;
a division module to divide the averaged FF-FFT block by the averaged FB-FFT block to obtain FFT correction values;
an inverse FFT module to convert the FFT correction values into time domain (TD) filter coefficient values;
a digital band-pass filter receiving the TD filter coefficient values, the input of said digital filter being the input digital signal;
a digital-to-analog (D/A) converter to convert the output of the digital band-pass filter into analog to obtain a corrected IF input signal;
a second band-pass filter having as input the corrected IF input signal;
an up-converter to convert the filtered corrected IF input signal in order to obtain a corrected RF input signal; and
means to apply the corrected RF input signal to the power amplifier.

13. The system of the claim 12, in which the input signal is a RF input signal, the linearizer module comprising:
a second down-converter to convert the input RF signal into IF input signal;
a third band-pass filter to filter the IF input signal; and
a second A/D converter to convert the filtered IF input signal into base-band digital signal.

14. The system of claim 12, in which the band-pass filters are digitally programmable for defining the bandwidth of said filter.

15. The system of claim 9 wherein the power amplifier is of the type selected among Solid State Power Amplifiers (SSPAs), Klystrons, Magnetrons, or Traveling Wave Tubes (TWTs).

16. The system of claim 12 wherein the power amplifier is of the type selected among Solid State Power Amplifiers (SSPAs), Klystrons, Magnetrons, or Traveling Wave Tubes (TWTs).

* * * * *